Dec. 26, 1961 R. S. GALES ET AL 3,014,550

NOISE EXPOSURE METER

Filed Feb. 10, 1958

INVENTORS
ROBERT S. GALES
IRVING (NMI) REHMAN
By Brown, Critchlow, Flick & Peckham
THEIR ATTORNEYS 3,014,550
Patented Dec. 26, 1961

3,014,550
NOISE EXPOSURE METER

Robert S. Gales, 1645 Los Altos Road, San Diego, Calif., and Irving Rehman, 5153 Tampa Ave., Tarzana, Calif.

Filed Feb. 10, 1958, Ser. No. 714,344
9 Claims. (Cl. 181—.5)

This invention relates generally to a method and apparatus for quantitative monitoring of the amount of exposure of personnel to intense noise and more particularly to a new and novel noise dosimeter useful for such purpose and an electro-chemical integrator-indicator cell constituting an essential part of the dosimeter.

The purpose of the aforementioned monitoring is to provide information needed to limit the exposure of personnel to safe values. In order to make use of noise exposure criteria recently promulgated, it is necessary to know the integrated noise exposure of each exposed individual; this integrated exposure being product of a certain function of sound pressure times time. As promulgated these criteria are based on the principle that the noise level at which ear damage begins is a function of frequency, higher noise levels being tolerated at low frequencies than at high frequencies. Furthermore, the assumption that equal energies (intensity×time) produce equal damage has been utilized to equate exposures to high level noise for a short time to exposures to somewhat lower levels for a longer time. Employment of these exposure criteria in the field is difficult in current practice which generally employs a point by point survey of the noise field using a sound level meter and frequency analyzer. The data so obtained are used to plot noise level contours, specifying zones of various noise levels. In order to apply these data to determine the noise exposure of an individual, the time spent by the individual in each zone must be determined. It is apparent that for noises of variable intensity, and for personnel who move about from zone to zone considerably, the excessive computation and compilation required make delineation of individual noise exposure quite impractical from the standpoint of cost and manpower required.

An alternative system, used in research work, utilizes a small battery-operated radio transmitter, worn by the noise exposed individual, to transmit sound pressure data to a fixed station where the noise exposure can be measured with conventional sound level meters and analyzers. This system, though capable of following specifically the noise exposure of the individual, is not satisfactory for routine noise exposure monitoring due to the complexity and cost of the equipment, its susceptibility to radio interference and propagation difficulties, and its requirement for a central receiving system with a separate radio frequency channel for each person monitored. It has the further disadvantage of not enabling the individual to readily monitor his own exposure.

The invention herein described overcomes these disadvantages by providing each noise-exposed person with an individual noise-dosimeter to be worn on his person. The noise dosimeter is completely self-contained and is sufficiently small, and light in weight to cause no interference to the individual in the performance of his normal duties. The noise exposure can be read out directly by the wearer on a scale calibrated in terms of acceptable exposure.

The noise dosimeter is electrically and mechanically simple and is inexpensive. The indicator capsule is expendable, and can be replaced upon an indication of a prescribed exposure magnitude or upon completion of a prescribed period such as an 8 hour day or a 40 hour week. There is no limit to the number of persons who can be simultaneously monitored by use of a sufficient quantity of the noise dosimeters.

The principal object of this invention is to provide a device which provides a visual indication of total noise exposure of an individual, combining in a single measure both the intensity and duration aspects of the exposure.

A further object is to provide such a device of sufficiently small size and light weight to enable it to be worn on the person of an individual as he goes about his normal activities.

A further object is the provision of a directly readable visual indicator to enable the wearer or others to directly determine the exposure without recourse to calculation or consultation of tables or charts.

Still another object is to provide an electrolytic integrator-indicator which provides a direct indication of the integrated product of current times time, subject to the condition that the input voltage exceeds a specified threshold value.

Still another object is to provide an expendable indicator capsule which is inexpensive, readily replaceable, and provides intrinsically a record of the exposure.

A further object is to provide a simple, reliable method for monitoring, documenting, and controlling the exposure of an individual or collection of individuals to noise.

The exact nature of this invention as well as other objects and advantages thereof will be readily apparent from consideration of the following specification relating to the annexed drawing in which the basic device consists of an acoustically-actuated current generator coupled to an electrochemical integrator-indicator to provide a visual indication of noise exposure. Noise exposure as used herein, refers to the time-integral of a particular function of sound pressure; that function being determined as that which, upon integration over an extended period of time, correlates most closely with hearing damage. The pressure function lies between $p$ and $p^2$ with present standards favoring $p^2$. The frequency response of the electro-acoustic system is designed so that the response to the various frequency components is weighted in accordance with their damaging effect on human hearing, or in accordance with any other physiologically objectionable property of noise for which a criterion can be established.

For a detailed description of a preferred embodiment of the invention, attention is called to the accompanying drawings wherein.

Figures 1, 2, 3, 4, 5, 6, 7, 8:
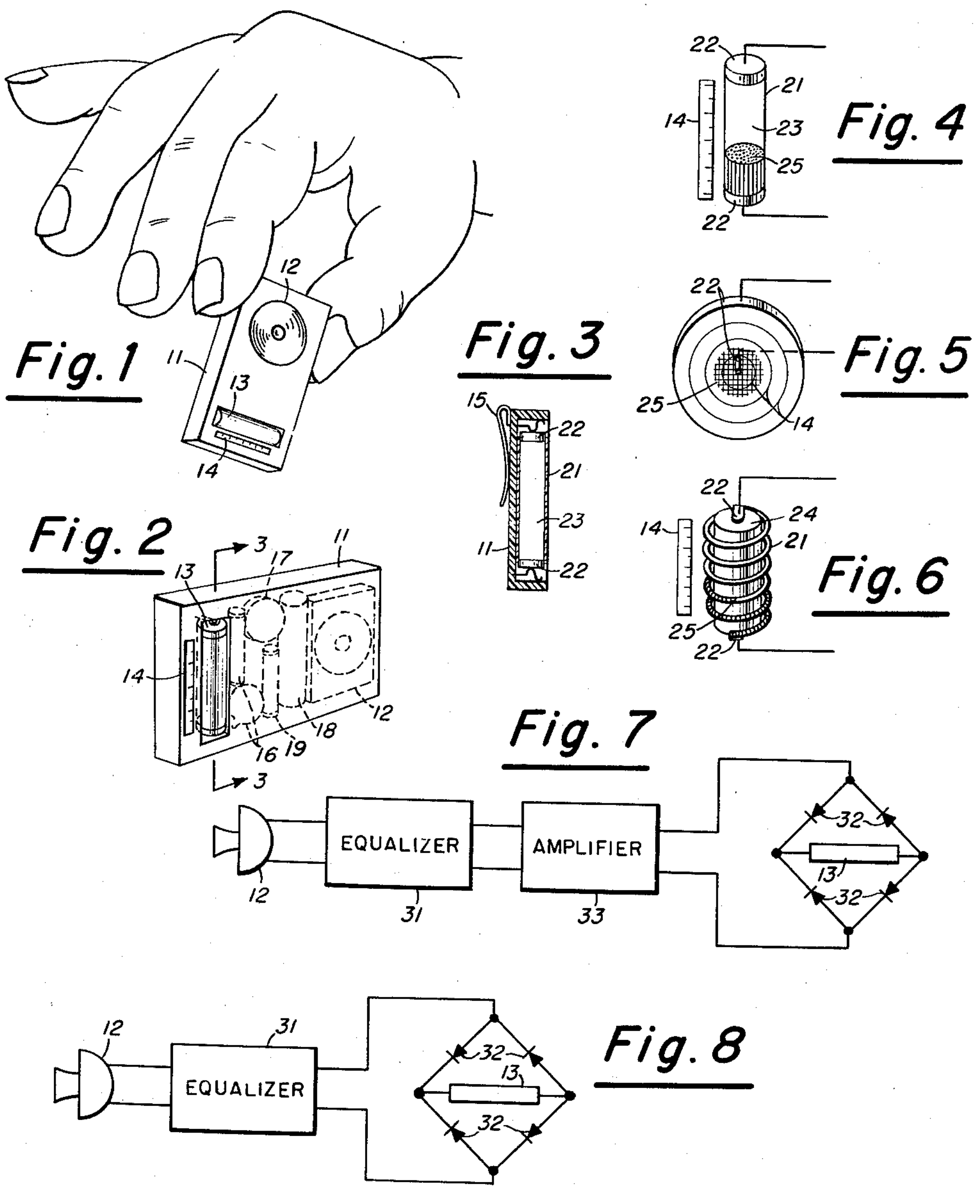
FIG. 1 shows a perspective view of the noise dosimeter.
FIG. 2 shows a transparent view illustrating a possible arrangement of components.
FIG. 3 shows a cross-sectional view of an integrator-indicator cell in place in its clip-type holder.
FIG. 4 shows a linear embodiment of the integrator-indicator cell.
FIG. 5 shows a radial embodiment of the integrator-indicator cell.
FIG. 6 shows a spiral embodiment of the integrator-indicator cell.
FIG. 7 shows a block diagram of an embodiment of the noise dosimeter including an amplifier.
FIG. 8 shows a block diagram of a simple embodiment of the noise dosimeter.

Referring now to FIG. 1, the arrangement of the basic components may be seen in this perspective view of one embodiment of the "noise dosimeter." The case 11 may be cast, extruded or molded plastic containing a microphone 12 of crystal, dynamic, magnetic or ceramic types, etc., depending upon the range of sensitivity and the current and voltage requirements of the electrochemical integrator-indicator cell or capsule 13 employed. The electrochemical capsule 13 is mounted in a clip-type holder adjacent to an indicator scale 14 that has been calibrated to read out for the desired duration of time and noise intensity to serve as a cumulative type of indicator or monitor. The small size of the noise dosimeter is readily apparent, as well as the clip 15 to facilitate attachment to the clothing of the wearer.

FIG. 2 is a transparent view showing the arrangement of components of an embodiment utilizing a transistor amplifier. Components shown are microphone 12, integrator-indicator cell 13, indicator scale 14, equalizer components 16, transistor 17, battery 18, and coupling condenser 19.

FIG. 3 shows a cross-section at 3—3 to show one method for mounting the integrator-indicator cell in a clip-type holder to facilitate replacement of the cell, which is expendable. The integrator-indicator cell may be made in any of several forms.

FIG. 4 shows a preferred embodiment, the linear version, which employs a transparent, hollow tube 21 of glass, plastic, or other suitable material, terminated at each end with electrodes 22 which are in contact with the electrolyte 23 contained within the tube, which is designed to clip into a holder as shown in FIG. 3.

FIG. 5 shows a radial embodiment of the integrator-indicator all in which the electrodes 22 are located at the center and periphery of a transparent flat cylindrical container which is associated with a radial scale 14.

FIG. 6 shows a spiral embodiment of the electrolytic integrator-indicator cell in which the tube 21 containing the electrolyte 23 is wrapped around a mandrel 24 and terminated at each end with electrodes 22. A scale 14 may be added as shown. The integrator function of the electrolytic cells described above results from an oxidation-reduction reaction occurring in the electrolyte during the passage of electric current between the electrodes, in which case the amount of the electrolyte oxidized and reduced is directly proportional to the number of coulombs of electricity passing through the electrolyte in accordance with Faraday's law. The integrator function of the cell results from the fact that the number of coulombs of electricity flowing through the cell in a given time is equal to the integral of the current over that time. The indicator function of the electrolytic cell is brought about by the addition to the electrolyte of a chemical indicator substance which changes color concurrent with the chemical reaction which takes place on the electrolyte on passage of electric current. Such indicators are well known in the chemical art and may be selected to show a wide variety of color changes when used in conjunction with appropriate electrolytes. The acid-base indicators, such as phenolpthalein, bromthymol blue, cresol red, metanil yellow, thymol blue, etc., may be used with various salts such as lithium chloride, sodium chloride, sodium nitrate, and others which will undergo an oxidation-reduction reaction on passage of current. Other indicators are also suitable such as starch when used in conjunction with an iodide electrolyte such as potassium or sodium iodide, and which produces a color change on oxidation of the iodide ion. The amount of color change resulting from the chemical reaction associated with the passage of current through the electrolyte may be read quantitatively by employing a colorimeter, or by a preferred method by noting the distances along the scale 14 that the color change has progressed from the electrode at which the color change originates. In order to use this preferred method, it is necessary to inhibit diffusion of the color changes within the cell, which may be accomplished by making the electrolyte in the form of a paste or gel. A suitable paste electrolyte may be made by mixing the salt solution and indicator components of the electrolyte with a water soluble, inert base such as is used as a base for medical salves and ointments. This technique results in an orderly, uniform progression of color from one electrode toward the other during the passage of current. The color boundary 25 is sharply and clearly defined as shown on FIG. 4, and thus in conjunction with scale 14 provides an accurate and readily interpreted measure of the time integral of the current flow.

The function of the combination of the electrolytic integrator-indicator cell with the other components required to make up the noise dosimeter may be best described by reference to FIG. 8 which shows a block diagram of the components of a simple embodiment of the noise dosimeter. The sound wave impinges on microphone 12, which transduces the sound pressure wave to a voltage which is impressed on the equalizer network 31 which is designed to produce, in conjunction with the response characteristic of the microphone an overall frequency response characteristic which provides the frequency weighting required to match the ear damage criterion. Principles of equalizer design are readily available in standard references such as "Motion Picture Sound Engineering", ch. 16 by Harry Kimball, published by the Research Council of the Academy of Motion Picture Arts and Sciences, 3d printing, 1938, or "Communication Engineering", ch. IX, by W. L. Everitt, published by McGraw-Hill Book Company, 1937. The voltage at the output of the equalizer is then rectified by a rectifier 32 having the response function required, for example, a square law characteristic may be used to provide an output which will integrate into energy. The rectified voltage is impressed on the electrolytic integrator-indicator cell 13, and said voltage will, if it exceeds the electromotive force of the electrolyte-electrode combination, cause a current to flow which will oxidize the electrolyte at the anode and reduce it at the cathode. If the electrolyte is an acidic solution of a salt, such as lithium chloride, for example, chlorine gas will be formed at the anode and lithium hydroxide at the cathode, this will cause the indicator present in the solution to show its acid color throughout the cell except at the cathode where passage of current will cause the alkaline color to show. Continued current flow will cause the color boundary to progress down the length of the indicator tube at a rate proportional to the current flow. If the voltage impressed upon the electrolytic cell is less than the electromotive force or "threshold" voltage of the cell, no reaction occurs. This property is important in order that sound levels below the ear damage point do not produce a reaction in the cell; otherwise an erroneous indication of dangerous noise exposure might result merely from a long continued exposure to noise levels below the danger point. This "threshold" property of the electrolytic cell is an important component of the electrolytic integrator-indicator cell as applied to the noise dosimeter.

FIG. 7 shows a block diagram of a slightly more complex, but more flexible noise dosimeter incorporating an amplifier 33 to increase the sensitivity as required, and to allow for variation of the amplification in order to adjust the "threshold" of the electrolytic action to correspond to the ear damage risk point of the noise level. The amplifier may be any of the various types such as transistor, vacuum tube, or others which will be apparent to one versed in the electronic art.

Figure 9:
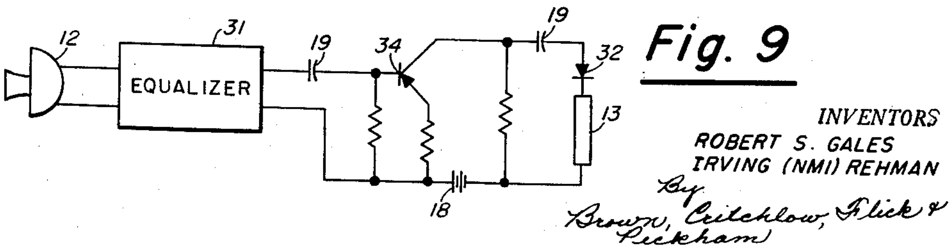
FIG. 9 shows a schematic diagram of one possible embodiment using an amplifier.

FIG. 9 shows a schematic diagram of one embodiment of a noise dosimeter employing a transistor 34 to provide amplification. Other components shown are the microphone 12, equalizer 31, coupling condensers 19, rectifier 32, and battery 18.

It will be understood that neither the self-powered simplified form or the amplifier (transistorized or vacuum tube) form of and various electrochemical visual indicator cell embodiments of our invention is limited to the mere details of construction and design and arrangement of parts disclosed, since many modifications may be made by those in the art without departing from the spirit and scope of the invention.

The foregoing constitutes a description of a noise dosimeter employing an electrolytic integrator-indicator cell in combination with a microphone and other necessary components to provide an individual person exposed to noise with a directly readable and simply interpreted measure of the amount of his noise exposure. The small size and light weight of the noise dosimeter make it possible to be worn on the person of the individual as he goes about his normal activities.

What is claimed is:

1. A noise exposure meter comprising a microphone for converting ambient noise into an electrical signal, equalizer means connected to the output of the microphone for discriminating between various frequencies of the electrical signal and for appropriately weighting the higher frequencies that are more damaging to the human ear to produce an overall frequency response output, means for rectifying the output voltage of the equalizer means, and electrochemical means, having a predetermined threshold voltage, connected to the rectifying means for measuring and visibly indicating the integrated current flowing through said measuring and indicating means.

2. A noise exposure meter comprising a microphone for converting ambient noise into an electrical signal, equalizer means connected to the output of the microphone for discriminating between various frequencies of the electrical signal and for appropriately weighting the higher frequencies that are more damaging to the human ear to produce an overall frequency response output, means for rectifying the output voltage of the equalizer means, and electrochemical means, having a predetermined threshold voltage, connected to the rectifying means for measuring and visibly indicating the integrated current flowing through said measuring and indicating means, said electrochemical measuring and indicating means including a transparent cell in the form of a tube closed at each end and provided with spaced electrodes, an electrolyte placed within the tube and adapted to undergo an oxidation-reduction reaction upon passage of current therethrough, a chemical indicator mixed with the electrolyte and adapted to change color concurrent with and in the region of the oxidation-reduction reaction in the electrolyte, and means for inhibiting diffusion of the electrolyte and indicator within the cell, whereby the change of color in the indicator will progress from one electrode to the other upon the passage of current through the electrolyte.

3. Apparatus in accordance with claim 2, in which the electrolyte consists of an aqueous solution of a salt from the group consisting of lithium chloride, sodium chloride and sodium nitrate, and in which the indicator is one of the group consisting of phenolphthalein, bromthymol blue, cresol red, metanil yellow, and thymol blue, and in which the means for inhibiting diffusion of the electrolyte and indicator includes a water soluble inert base forming a paste or gel when added to the electrolyte.

4. Apparatus in accordance with claim 2, in which the electrolyte consists of an aqueous solution of a salt from the group consisting of lithium chloride, sodium chloride and sodium nitrate, and in which the indicator is one of the group consisting of phenolpthalein, bromthymol blue, cresol red, metanil yellow, and thymol blue.

5. Apparatus in accordance with claim 2, in which the means for inhibiting diffusion of the electrolyte and indicator includes a water soluble inert base forming a paste or gel when added to the electrolyte.

6. Apparatus in accordance with claim 2, in which the electrolyte consists of an aqueous solution of an inorganic iodide salt and in which the indicator is a starch.

7. Apparatus in accordance with claim 2, in which the cell is a tube of relatively small diameter in proportion to its length, the tube being bent to form a helix.

8. Apparatus in accordance with claim 2, in which the cell is in the form of a flat hollow cylinder having a diameter greater than its height and in which one of the electrodes is positioned at the center of the cylinder and the other electrode extends around the inner surface thereof, so that the color change of the indicator progresses radially of the cell from one electrode to the other.

9. Apparatus in accordance with claim 2, that also includes means for amplifying the output of the equalizer means to vary the voltage impressed on the measuring and indicating means and thereby to adjust the effective threshold response of said last means.

References Cited in the file of this patent

UNITED STATES PATENTS

| | | |
|---|---|---|
| 281,352 | Edison | July 17, 1883 |
| 925,064 | Whitney | June 15, 1909 |
| 1,006,612 | Weintraub | Oct. 24, 1911 |
| 1,048,156 | Hatfield | Dec. 24, 1912 |
| 2,156,945 | Huth et al. | May 2, 1939 |
| 2,322,708 | Burger | June 27, 1943 |
| 2,884,085 | Von Wittern et al. | Apr. 28, 1959 |